United States Patent [19]

Schroeder et al.

[11] Patent Number: 5,731,702
[45] Date of Patent: Mar. 24, 1998

[54] HIGH ACCURACY ANGLE BASED ROTATION SENSOR WITH TIME BASED BACK UP

[75] Inventors: Thaddeus Schroeder, Rochester Hills; Bruno Patrice Bernard LeQuesne, Troy, both of Mich.; Raymond Ora Butler, Jr., Anderson, Ind.; Anthony Leo Marks, Novi, Mich.

[73] Assignee: General Motors Corporation, Detroit, Mich.

[21] Appl. No.: 701,254

[22] Filed: Aug. 21, 1996

[51] Int. Cl.⁶ .............................. G01B 7/30; G01P 3/489; F02P 7/067; H03M 1/22
[52] U.S. Cl. .................. 324/207.21; 123/617; 324/173; 324/207.22; 324/207.25; 341/15
[58] Field of Search ........................ 324/160, 163, 324/165, 166, 173, 174, 207.2, 207.25; 341/13, 15; 123/414, 617

[56] References Cited

U.S. PATENT DOCUMENTS

| | | | |
|---|---|---|---|
| 4,904,937 | 2/1990 | Takahashi et al. | 324/207.21 |
| 5,029,304 | 7/1991 | Tolmie, Jr. | 324/207.2 |
| 5,313,159 | 5/1994 | Allwine, Jr. | 324/207.2 |
| 5,444,370 | 8/1995 | Wu | 324/207.2 |
| 5,469,054 | 11/1995 | Bicking | 324/207.2 |
| 5,488,294 | 1/1996 | Liddell et al. | 324/207.2 X |
| 5,570,016 | 10/1996 | Schroeder et al. | 324/207.21 X |

Primary Examiner—Gerard R. Strecker
Attorney, Agent, or Firm—Vincent A. Cichosz

[57] ABSTRACT

A rotation sensor includes a binary encoded target wheel and a pair of sensors disposed about the target wheel periphery. One of the sensors provides a signal indicative of the passage of regular angular intervals of the target wheel and the other of the sensors provides binary states corresponding to the regular angular intervals.

8 Claims, 1 Drawing Sheet

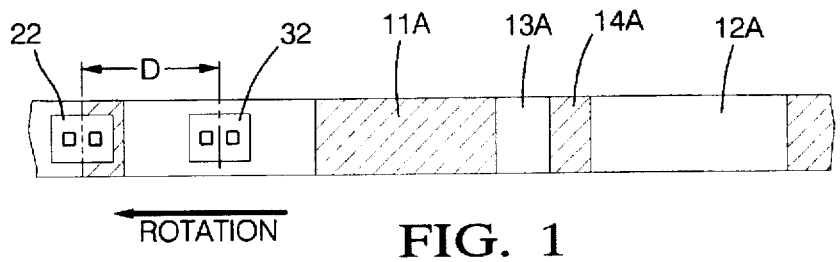
FIG. 1
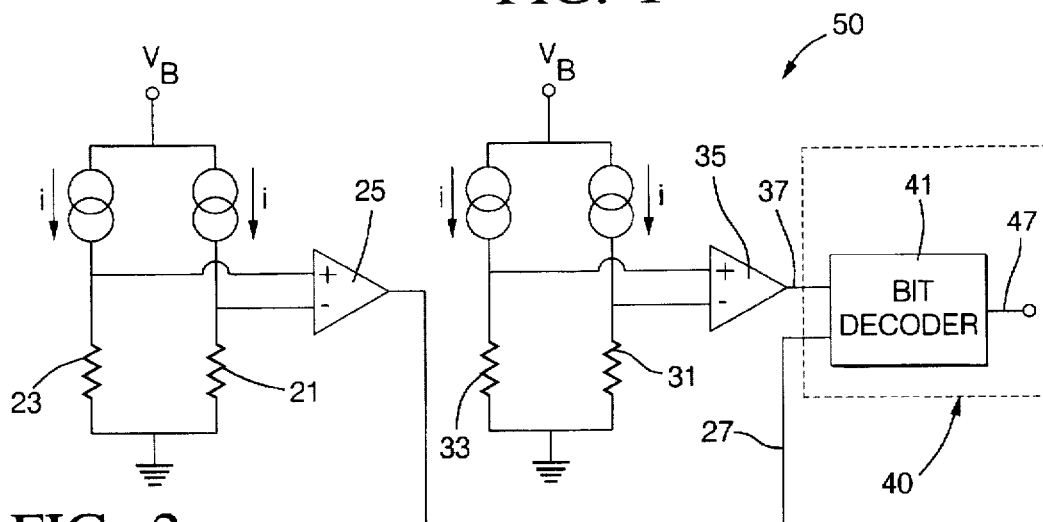
FIG. 2
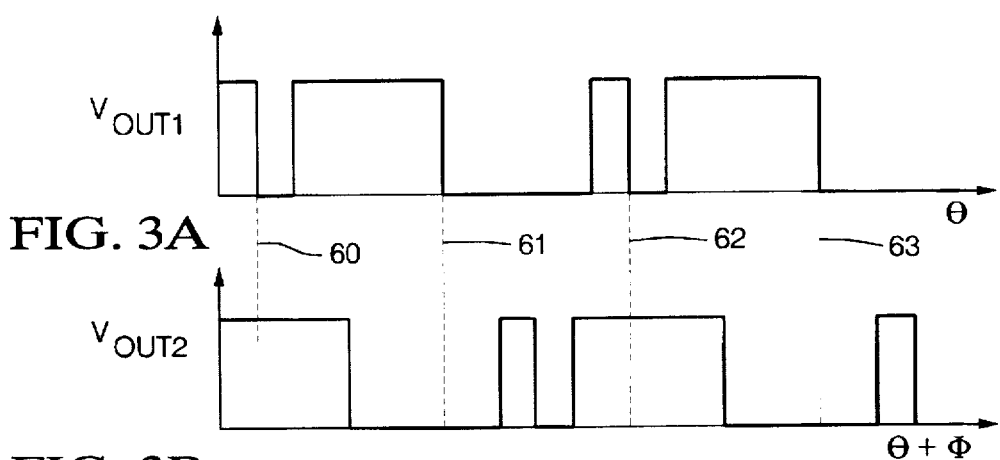
FIG. 3A
FIG. 3B
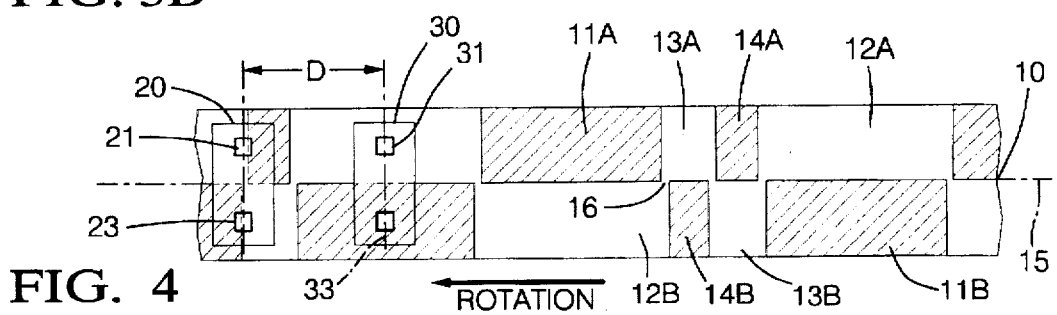
FIG. 4

5,731,702

HIGH ACCURACY ANGLE BASED ROTATION SENSOR WITH TIME BASED BACK UP

TECHNICAL FIELD

The present invention relates to the field of displacement sensors generally and more particularly to the field of rotational sensors. High accuracy rotational sensors are particularly advantageous when employed as part of an internal combustion engine crankshaft for determining velocity and absolute position.

BACKGROUND OF THE INVENTION

Absolute position sensing requires a high degree of accuracy in determining or sensing rotational events. Certain applications such as engine crankshaft position sensing benefit from high accuracy absolute position sensing. Absolute position data may be used for example for quick engine starting and complex combustion control and diagnostic functions. It is known to use a dual track binary encoded target wheel comprising a plurality of incremental position regions characterized by both tracks having the same one of low or high permeability states and binary pattern regions interposed therewith which allows for absolute crankshaft position detection in some fraction of a single rotation. Such binary pattern is established by the transition of only one of the two tracks from the one low or high permeability states associated with the incremental position region to the other one of the low or high permeability state. One such transition in one track following an incremental position region signifies a first binary value and one such transition in the other track following a different incremental position region signifies a second binary value. An exemplary encoding scheme as summarized above is disclosed in U.S. patent application No. 08/252,293, now U.S. Pat. No. 5,570,016, assigned to General Motors Corporation. However, such arrangement generally suffers from positional accuracy shortfalls in as much as the transitions demarcating the beginning and end of the incremental position regions are not themselves identical one incremental position region from the next and rely upon a transition on one of the two tracks only. Such sensing schemes may be referred to generally as dual track angle-based encoding since such results in time independent data. Incremental positional accuracy may be improved by using a complementary or mirror image dual track target wheel but such arrangement necessarily eliminates an angle-based binary encoding scheme as described above.

An alternative method using a binary encoded target wheel uses a pattern of wide and narrow regions of high and low permeability in a single track target wheel. Generally, transitions from one of the low or high permeability regions to the other of the low and high permeability regions occur at regular angular intervals and are followed by either a relatively narrow or wide region of the other of the low and high permeability. The relative duration of the region following a transition determines the equivalent binary value. However, under certain acceleration or deceleration situations, the duration of the region may indicate an incorrect binary value. For this reason, certain limitations are placed upon the ratiometric relationship between the wide and narrow regions. The larger the ratio, the less likelihood of misindication. However, the narrow region is limited by the linear width thereof which can be reliably detected by a magnetoresistive sensor over air gap and temperature tolerance ranges. Such limitations ultimately reduces the available resolution for an encoded sensor operating in a time based mode.

SUMMARY OF THE INVENTION

Therefore, a robust and highly accurate rotation sensor is desired. It is therefore a general object of the present invention to provide such a sensor by employing a binary encoded target wheel having a unique encoded signature allowing highly accurate discernment of absolute angular position within a fractional rotation. Another object of the present invention is to provide discernment of the absolute angular position in a manner which is time independent. Yet another object is to provide for a redundant back up mode of operation.

These and other objects and features of the invention are provided for in a rotational sensor including a binary encoded target wheel and a pair of sensors. The target wheel includes regions which are delimited angularly. Each region is characterized by one of two characteristics detectable and differentiated by the sensors. Each region is further characterized by one of two non-equivalent angular widths. The various regions are so arranged that adjacent regions have alternating ones of the two characteristics and no more than two adjacent regions are of the same one of the non-equivalent angular widths. Adjacent regions having non-equivalent widths represent respective bits whose binary value corresponds to the detectable characteristic.

The pair of sensors are disposed adjacent to the target wheel with an angular separation therebetween which provides for one of the two sensors to be in positions relative the target wheel to detect the characteristics of the adjacent region as the target wheel rotates through predetermined incremental angles with respect to the other sensor. In the most general sense, the angular separation is greater than the smaller one of the non-equivalent angular widths plus a whole number multiple of the sum of the non-equivalent angular widths and less than the larger one of the non-equivalent angular widths plus the whole number multiple of the sum of the non-equivalent angular widths. The narrowest angular separation is therefore one which is greater than the narrowest angular width and less than the widest angular width.

One sensor is adapted to provide angular reference signals for indicating rotation of the target wheel through predetermined angular intervals. These reference signals are consistently one of falling or rising edges corresponding to transitions from one region of one characteristic to an adjacent region of the other characteristic. The other sensor is adapted to provide a bi-stable output state signal having one of two output states in accordance with the particular detectable characteristics of the adjacent region.

In accord with one aspect of the arrangement described, the first sensor provides the angular reference signals which are used to clock the state of the bi-stable output state signal provided by the other sensor, thereby providing an angle based decoded bit.

In accord with another aspect of the arrangement described, the first sensor provides a bi-stable output state signal having one of two output states in accordance with the particular detectable characteristics of the adjacent region. In essence then, the signals from both sensors are substantially identical signals separated in phase from one another but always physically separated by a fixed angular separation. The invention further provides for detection of a lost or otherwise unreliable signal from either of the two sensors upon which the other of the two sensors is used in a time based back-up mode of decoding the binary encoded target wheel. The time based decoding may be accomplished through simple comparisons or ratiometeric determinations with respect to the respective durations of a pair of adjacent output states from the sensor corresponding to a pair of angularly adjacent regions of non-equivalent angular widths.

In a preferred embodiment, the detectable characteristic comprises the permeability of the target wheel and the sensors comprise magnetoresistive devices.

In an alternative embodiment including permeability as the detectable characteristic, the binary encoded target wheel comprises two distinct tracks, each being as described with respect to the previous embodiment. The two tracks are complementary such that axially adjacent regions of one track are of substantially the same angular width but of different permeabilities. Axially adjacent regions thereby define one of two cross-track patterns with respect to the permeabilities. A preferred arrangement for the target wheel having such a dual track configuration provides for a slight angular overlap of the relatively low permeability regions from one track to the other.

The pair of sensors are disposed adjacent to the target wheel with an angular separation therebetween which provides for one of the two sensors to be in positions relative the target wheel to detect the cross-track patterns of the adjacent regions as the target wheel rotates through predetermined incremental angles with respect to the other sensor. In the most general sense, the angular separation is greater than the smaller one of the non-equivalent angular widths plus a whole number multiple of the sum of the non-equivalent angular widths and less than the larger one of the non-equivalent angular widths plus the whole number multiple of the sum of the non-equivalent angular widths. The narrowest angular separation is therefore one which is greater than the narrowest angular width and less than the widest angular width.

One sensor is adapted to provide angular reference signals for indicating rotation of the target wheel through predetermined angular intervals. These reference signals are consistently one of falling or rising edges corresponding to transitions from one region of one cross-track pattern to an adjacent region of the other cross-track pattern. The other sensor is adapted to provide a bi-stable output state signal having one of two output states in accordance with the particular cross-track pattern of the adjacent region.

In accord with one aspect of the arrangement described, the first sensor provides the angular reference signals which are used to clock the state of the bi-stable output state signal provided by the other sensor, thereby providing an angle based decoded bit.

In accord with another aspect of the arrangement described, the first sensor provides a bi-stable output state signal having one of two output states in accordance with the cross-track pattern of the adjacent region. In essence then, the signal s from both sensors are substantially identical signals separated in phase from one another but always physically separated by a fixed angular separation. The invention further provides for detection of a lost or otherwise unreliable signal from either of the two sensors upon which the other of the two sensors is used in a time based back-up mode of decoding the binary encoded target wheel. The time based decoding may be accomplished through simple comparisons or ratiometeric determinations with respect to the respective durations of a pair of adjacent output states from the sensor corresponding to a pair of angularly adjacent regions of non-equivalent angular widths.

BRIEF DESCRIPTION OF THE DRAWINGS

FIG. 1 illustrates a view of a rotational sensor in accordance with a first embodiment of the present invention;

FIG. 2 illustrates exemplary circuitry for sensing and decoding signals from a sensor as shown in FIG. 1 in accordance with the invention; and FIGS. 3A and 3B illustrate output signals from the circuitry shown in FIG. 2;

FIG. 4 illustrates a view of a rotational sensor in accordance with a second embodiment of the present invention.

DESCRIPTION OF THE PREFERRED EMBODIMENT

With reference now to the figures wherein labels common among the various views correspond to similar features, a preferred embodiment of the present invention is shown in FIG. 4 wherein first and second dual element magnetoresistive (MR) sensors, generally designated 20 and 30 respectively, cooperate with a rotating dual-track, ferromagnetic target wheel generally designated 10. Target wheel 10 in the figure is illustrated as if the curved periphery thereof was laid flat so as to facilitate illustration and explanation. The target wheel is adapted for rotation in the direction of the labeled arrow, and as it rotates it moves beneath the sensors 20 and 30 which are disposed in spaced adjacency therewith. Target wheel 10 comprises two tracks substantially on axially opposite sides of a centerline labeled 15 in the figure. Centerline 15 is substantially orthogonal to the rotational axis the target wheel.

For purposes of establishing a descriptive convention, the track above the centerline 15 in the figure may be referred to as the upper track or first track and the track below the centerline may be referred to as the lower track or the second track. The first and second tracks are generally described as mirror image tracks for the reason that a high permeability region on one track is adjacent a low permeability region on the other track. High permeability regions are illustrated in shade or hatch while the regions of low permeability are illustrated in blank. The entire dual track target wheel comprises only four combinations of two relative region widths (wide and narrow) and two relative permeabilities (low and high). Exemplary ones of such combinations for both tracks include wide high permeability regions (11A, 11B), wide low permeability regions (12A,12B), narrow high permeability regions (14A,14B), and narrow low permeability areas (13A,13B). While the general construction of the dual track target wheel is one of mirror image as described, a preferred fine tuning of the structure resulting in greater accuracy and manufacturability is embodied in slight radial offsets of proximally adjacent cross-track high permeability areas resulting in radial gaps between ends of such proximally adjacent cross-track high permeability areas. For example, region 11A and region 14B each terminate to provide a radial gap 16 between the respective terminal ends. U.S. patent application Ser. No. 08/262,097, assigned to General Motors Corporation, sets forth such an offset feature in a dual track target wheel.

It is generally understood that the high and low permeability regions may be provided by toothed wheel arrangements or other means such as ferromagnetic stamped cylindrical members having through holes defining low permeability areas and the undisturbed stock defining high permeability areas. Preferably, the dual track target wheel is formed as a single unitary structure using well known powder metal forging (PMF) operations or by casting the sections separately in similar PMF operations and later joining the sections such as during a sintering operation normally practiced with such PMF produced components. Of course, joining the target wheel to a rotating member may require that the castings provide the necessary aperture through the rotational axis of the target wheel or additional machining operations post-sintering providing such provision. Low green strength would generally preclude significant machining operation prior to sintering. In applications wherein the target wheel is indexed to other features of the rotating member, such as for example an engine crankshaft, this method of manufacture is generally too process intensive. Accordingly, such dual target wheels are most readily produced as integral with the particular rotating member and most advantageously applied to an engine crankshaft or other such indexed application. An engine crankshaft casting preferably is produced in conventional fashion with a dual target wheel blank on a portion thereof coaxial with the rotational axis. This process is a variation of well known crankshaft castings wherein a single track target wheel blank is cast into an appropriate portion thereof. Preferably, in the case of a dual-track target wheel, however, the relevant portions of the casting may take the form of a target wheel blank of substantially double the thickness of a single target wheel blank. A first grinding operation is performed to true the entire blank to the outer diameter of the high permeability regions, followed by a second grinding operation to a lesser diameter performed only on the portion of the blank corresponding to the low permeability regions. The greater of the two diameters therefore corresponds to the high permeability regions and the lesser of the two diameters corresponds to the low permeability regions.

The dual track target wheel 10 is illustrated with both tracks having substantially equivalent axial thickness. In many of the various manufacturing processes available for producing such a target wheel, a main consideration for the thickness of the individual sections is the ability of each section to withstand the forces of machining processes without damage. This may be especially true where cutting tools are applied at high rates. In application to engine crankshaft sensing, location of the target wheel on the crankshaft is limited to certain areas as is placement of the MR sensor limited with respect to the engine block. Therefore, non-equivalency in the thicknesses of the two sections may be required to ensure adequate structural strength and alignment of the two sections A preferred construction for dual element MR sensors 20 and 30 includes respective biasing magnets (not shown), a respective pair of magnetoresistive elements 21,23 and 31,33, and a respective ferromagnetic shim (not shown) therebetween. Such a sensor construction may be found in U.S. Pat. No. 4,926,122 also assigned to General Motors Corporation. Respective first MR element 21 associated with the first sensor 20 is located radially adjacent the first track and respective second MR element 23 associated with the first sensor 20 is located radially adjacent the second track. Similarly, second sensor 30 has associated therewith respective first and second MR elements 31 and 33 radially adjacent the first and second tracks respectively.

With reference to the processing circuit generally designated by the numeral 50 in FIG. 2, an operational description sensing arrangement is introduced. The individual MR elements 23 and 21 associated with the first sensor 20 are modeled as resistors. It is well known that the resistance value of a MR element varies in accordance with the magnetic flux passing therethrough. One end of each MR is coupled to a circuit ground. The other ends of both of the MR elements 23 and 21 are coupled to respective current sources powered by voltage $V_B$ which are effective to provide constant currents to the MR elements 23 and 21. The non-inverting input of a high gain, low hysteresis, operational amplifier or comparator 25 is coupled to the current source/MR sensor 23 junction. Similarly, the other current source/MR sensor 21 junction is coupled to the inverting input of the comparator 25. For purposes of the present illustration, it is assumed that the output of the comparator 25 is the variety coupled to the collector of an output stage transistor. A voltage is impressed across each MR element in proportion to the respective resistance value and provided as a respective input to the comparator 25. Whenever the comparator 25 sees a voltage at the non-inverting input in excess of the voltage seen at the inverting input, an open collector is established thereby resulting in a high level voltage at the output line 27. Whenever the comparator 25 sees a voltage at the inverting input in excess of the voltage seen at the non-inverting input, a grounded collector is established thereby resulting in a low level voltage at the output terminal 27.

A dual track target wheel, such as conceptualized as the mirror image target wheel as described, when rotating in proximity to a sensor as described produces substantially angle coincident inverse resistive changes to the individual MR elements. These resistive changes may be translated into respective voltage signals by a circuit substantially as shown in and described with respect to FIG. 2, the output of which may provide highly accurate position information corresponding to the transitions between output voltage levels.

Similarly, the individual MR elements 33 and 31 associated with the second sensor 30 are modeled as resistors. One end of each of these MR elements is coupled to a circuit ground. The other ends of both of the MR elements 33 and 31 are coupled to respective current sources powered by voltage $V_B$ which are effective to provide constant currents to the MR elements 33 and 31. The non-inverting input of high gain, low hysteresis, comparator 35 is coupled to the current source/MR sensor 33 junction. Similarly, the other current source/MR sensor 31 junction is coupled to the inverting input of the comparator 35. Comparator 35 and 25 are essentially identical with respect to operational characteristics. Therefore, whenever the comparator 35 sees a voltage at the non-inverting input in excess of the voltage seen at the inverting input, a high level voltage at the output line 37 results. Whenever the comparator 35 sees a voltage at the inverting input in excess of the voltage seen at the non-inverting input, a low level voltage at the output terminal 37 results.

The general circuit processing technique disclosed may be referred to as a differential processing with respect to the inputs of the comparators. The complementary arrangement of the adjacent tracks provides for highly accurate angular discernment and bi-stable detection. That is to say, the transitions from region to region are precisely detected by a state change of the comparator output and each state remains stable until the transition to the next region. Alternative arrangements for signal processing are envisioned. For example, a pair of MR elements associated with one sensor such as elements 23 and 21 with sensor 20, may be commonly coupled at one respective end to one input of a comparator with the other respective ends being coupled one to ground and one to $V_B$ or a current source. Such arrangement provides for a voltage division circuit having rapid voltage swings from one bi-stable state to another. The other input to the comparator would be coupled to the center point of a resistor bridge also coupled between ground and $V_B$ or the current source. Again, a low hysteresis comparator would respond most rapidly to the rapidly rising and falling input signal provided by the combined MR elements. The output state of the comparator would likewise be bi-stable in accord with the particular transition effected by the target wheel.

FIGS. 3A and 3B show individual resultant output voltages $V_{out1}$ and $V_{out2}$ corresponding to lines 27 and 37 respectively as illustrated in FIG. 2. The general appearance of the output voltages would be similar with other processing arrangements as described and therefore the description to follow is equally applicable to alternatives contemplated herein. As can be seen from examination of all figures, the output voltages vary between a high level and a low level. Beginning at the left of FIG. 3A, the output voltage on line 27 ($V_{out1}$ associated with sensor 20 goes low at a rotation angle θ corresponding to broken line 60 whereat MR element 21 transitions from a low to a high permeability region and MR element 23 transitions from a high to a low permeability region as illustrated in FIG. 4. As the target wheel rotates and high and low permeability regions presented to the MR elements once again switch, $V_{out1}$ goes high. The toggling of $V_{out1}$ continues to occur as long as the rotation of the dual track target wheel continues. Assuming that the target wheel is rotating at a substantially constant velocity, a pattern of wide and narrow pulse widths of $V_{out1}$ are established.

Each of the sensors 20 and 30 are separated by a distance 'D' along the periphery of the target wheel corresponding to a separation angle φ. The output voltage on line 37 ($V_{out2}$) associated with sensor 30 corresponds to the dual track target wheel pattern therebelow. Assuming that the target wheel is rotating at a substantially constant velocity, the pattern of wide and narrow pulse widths of $V_{out2}$ is identical to the pattern of $V_{out1}$ but leads the pattern of $V_{out1}$ in phase by angle φ. Another way to conceptualize the relationship between the respective output voltages is that as the target wheel rotates through an angle θ beneath sensor 20, the target wheel rotates through an angle θ+φ beneath sensor 30. In application where the rotation of the target wheel is subject to acceleration and deceleration, the pulse width patterns may in fact vary from one another with respect to the same general angular regions sensed, but the pattern of correspondence of respective output voltage states at any given rotation angle does not vary. That is to say, respective pulse widths $V_{out1}$ and $V_{out2}$ may not be equivalent with respect to time if the velocity of the target wheel varies; however, the relationship of output states of $V_{out1}$ and $V_{out2}$ at any absolute rotation angle will not vary regardless of velocity, accelerations or decelerations.

The binary encoded pattern in accordance with the present invention comprises pairs of circumferentially adjacent wide and narrow regions of alternating high and low permeabilities. All narrow regions have substantially equivalent linear widths ($W_n$) and all wide regions likewise have substantially equivalent linear widths ($W_w$). Each pair of circumferentially adjacent wide and narrow regions therefore has an overall linear width of $W = W_n + W_w$. W is a whole number fraction of the circumference of the target wheel in accord with the desired angular resolution. For example, for a desired 24 bit per revolution resolution arrangement, W will be the linear distance along an arc on the target wheel delimited by radii separated by the angle 360°/24°=15°. Of course the absolute value of W will be a function of the target wheel diameter. Any circumferentially adjacent pair of wide and narrow regions are circumferentially adjacent another pair of wide and narrow regions. Since all pairs of circumferentially adjacent regions comprise one high and one low permeability region, each region of one permeability is adjacent another region of the other permeability. It follows that all transitions from one pair of wide and narrow regions to an adjacent pair of wide and narrow regions are characterized by the same shift in permeability. Using the partial pattern shown in FIG. 4 as an example, and the first track in particular, the pair of wide and narrow regions comprising region 11A and 13A transitions into the pair of wide and narrow regions comprising region 14A and 12A by a shift from low permeability (13A) to high permeability (14A). Likewise, the pair of wide and narrow regions comprising region 14A and 12A will transition to an adjacent pair of wide and narrow regions to the right in the figure by a shift from low permeability (12A) to high permeability. Therefore, each transition between adjacent pairs of adjacent wide and narrow regions corresponds to an incremental position or incremental angle on the target wheel.

The binary encoded pattern is established by the circumferentially adjacent pairs of wide and narrow regions. Each such pair has associated with it one of the two binary values. The binary value is a function of the relative positions of the narrow and wide regions comprising the pair. Since it is known that all adjacent regions are of different permeabilities, the binary value established by the circumferentially adjacent pairs of wide and narrow regions may alternatively be described as a function of the permeability of the wide region of the pair. The encoding may completely cover the entire circumference of the target wheel or any particular portion thereof.

With the relative rotation direction as indicated by the arrow in FIG. 4, incremental angle positions on the target wheel will always cause negative going edges on the output voltages $V_{out1}$ and $V_{out2}$ corresponding to sensors 20 and 30 respectively. Of course the respective inputs to either of the comparators in the circuit of FIG. 2 may be swapped to provide an inversion of the respective output voltage illustrated in FIGS. 3A and 3B in accord with desired output states. In any case, incremental angle positions on the target wheel passing beneath the sensors 20 and 30 will always cause an edge in one direction in the respective output voltage. Exemplary ones of these edges in the case of sensor 20 are shown associated with broken lines 60-63 in FIGS. 3A and 3B. The broken lines also correspond to the state of the output voltage $V_{out2}$ corresponding to sensor 30 when the target wheel has rotated through the incremental angle position beneath sensor 20.

The negative going edges of $V_{out1}$ are utilized as an angle event clock signal for the purpose of decoding the binary pattern of the target wheel. Sensor 20 is therefore used in this embodiment as an angle event sensor. The minimum distance 'D' separating the sensors necessarily must fall within a certain range in order for the decoding of individual bits to be effectuated. The separation must be such that an angle position event detection occurring as the result of permeability transition into narrow regions finds the other sensor above wide regions of the target wheel tracks. Additionally, the separation must also be such that an angle position event detection occurring as the result of permeability transition into wide regions likewise finds the other sensor 30 above wide regions of the target wheel tracks. Sensor 30 is therefore seen to sense binary states of the wide regions. Sensor 30 is therefore used in this embodiment as a data sensor. A preferred general case minimum linear spacing D of the two sensors 20 and 30 satisfying this general requirement for an exemplary target wheel as described is one-half the overall linear width W of circumferentially adjacent wide and narrow regions. This spacing arrangement will sense the binary state of the wide regions closest to the angle clock sensor. Additionally, for packaging reasons or for sensor cross-talk isolation reasons, it may be desirable to separate the angle clock sensor from the data sensor even further. This may be accomplished in unit increments in this preferred example where the actual separation distance is the general case distance plus a whole number multiple of the overall linear width W of the pairs of circumferentially adjacent wide and narrow regions as previously described. Separations may also be referred to in terms of the angular metrics such as degrees and radians. Using a convention of degrees and a target wheel with 15° separating incremental angle positions, a preferred minimum separation angle would be 7.5° and alternative separations would be expressed as 7.5°+n*15° where n is a whole number.

The bit by bit decoding of the target wheel binary data is therefore seen to be a relatively simple matter of monitoring the output voltage state of the one of the sensors designated as the data sensor and clocking its state in accordance with the angle position event as determined by the selected output voltage edge induced upon the detection circuitry by the other one of the sensor designated as the angle clock sensor. With reference back to FIGS. 3A and 3B, the angle position events 60–63 are used to clock the sequential states 1,0,1,0 of $V_{out2}$ as shown.

FIG. 2 illustrates a computer based controller 40 such as conventional powertrain control module adapted for monitoring the output voltages on lines 27 and 37. Included in the controller is bit decoding logic 41 which returns a binary value on 47 representing the decoded information.

As indicated with respscheme described clocked data decoding scheme described above, the output state on line 37 is clocked in upon each incremental angle event. Angle based bit decoder 41 may comprise for example a conventioml D-flip-flop (not illustrated) having a data input coupled to line 37, negative edge triggered clock input coupled to line 27 and output comprising line 47. Line 47 may thereafter be coupled to a bank of n shift registers to propagate the bit pattern therethrough as progressive angle events are detected. The n-bit shift register comprises a data word of sufficient length to identify the absolute angular position of the target wheel and rotating member in a well known manner.

In accord with another aspect of the present invention, bit decoder 41 may also comprise time based decoding logic operational in parallel with or in the alternative to the angle based decoding logic. Only one of the two lines 27 and 37 is required for time based decoding. In such an arrangement, bit decoder 41 additionally comprises a high speed clock signal which may advantageously be derived from the controller clock and appropriate frequency division as required. Recalling that the binary value of a wide and narrow adjacent pair is a function of the relative positions of the narrow and wide regions comprising the pair, bit decoder may comprise an up/down counter which is reset upon each incremental angle event, which in the present embodiment comprises the negative edge of the respective output voltage of the monitored line 27 or 37. High speed clock pulses are input to the up/down counter and the output state of the monitored line 27 or 37 is input to the up/down count direction input of the counter. The algebraic sign of the counter prior to reset establishes the binary state of the corresponding wide and narrow pair.

Time based methods of decoding, however, rely on respective durations of low and high states which are subject to variations due to velocity changes. Accelerations and decelerations during the decoding may result in inaccurate decoding unless the relative wide and narrow regions can be assured of no overlap in the possible durations. Therefore, the greater the ratio between the widths of the wide and narrow regions, the more robust the time based decoding may be. While time based decoding as a primary means of decoding may require data accuracy over very wide operating conditions, its use in a secondary back-up mode of decoding may require accuracy over more limited operating conditions.

The angle based and time based decoding logic described above are representative of the decoding function. It is anticipated that a variety of other angle based and time based logic techniques may be employed in arriving at the respective angle based and time based decoded bits.

In accordance with one aspect of the present invention, the angle based bit decoding is operative when both sensors 20 and 30 are operational. The time based bit decoding is operative when one of the two inputs corresponding to lines 27 and 37 is diagnosed as faulty or unreliable. Conventional data acquisition fault detections such as open and short circuits may be used to detect a fault in one of the two inputs and thereafter use the non-faulty line for time based bit decoding as a back-up to the primary angle based decoding.

It will be recognized by one having ordinary skill in the art that certain angular offsets may need to be made to the raw decoded signal in order to obtain the absolute angular position of the rotating member depending upon which of the angle based or time based decoding is being utilized. Similarly, appropriate offsets are needed depending upon which of the two sensors is used in time based decoding. Such offsets are generally associated with processing of the bit data after decoding and are beyond the scope of the disclosure herein.

FIG. 1 specifically sets forth an alternative embodiment comprising only a single track target wheel. The single track target wheel in the exemplary figure is shown to be identical to the first track of the dual track target wheel of the preferred embodiment of FIG. 4. Of course the single track target wheel may also be constructed with the mirror image pattern of the second track of the dual track target wheel. Space limitations or performance requirements may dictate that such a single track target wheel arrangement be used, it being generally believed, however, that the dual track target wheel provides for greater angular accuracy in the detection of the transitions from region to region. Since the single track target wheel is identical to the first track of the dual track target wheel, the wide and narrow and high and low permeability regions are designated by the same reference numerals used in FIG. 4 and the description of the first track thereof.

In this alternative single track sensing arrangement, two dual element MR sensors, designated 22 and 32, are also employed. The desired angular spacing is determined in the same fashion as that discussed with respect to the dual track arrangement. Therefore, the distance 'D' in the present embodiment illustrated in FIG. 1 is determined in accord with the considerations previously set forth in the discussion of the dual track arrangement. Each pair of MR elements associated with each respective sensor may be coupled as shown in FIG. 2. For example, the MR elements associated with sensor 22 are coupled in place of the schematic elements 23 and 21 and likewise the MR elements associated with sensor 32 are coupled in place of the schematic elements 33 and 31. Comparators used in the differential processing of the signals in the present embodiment, however, may desirably provide for a greater degree of hysteresis than those employed in the dual track embodiment. The hysteresis provides a latching function through selection of appropriate trigger threshold points not required nor desirable in the dual track embodiment. Signals substantially equivalent to those illustrated in FIG. 3 are thereby developed and utilized in the same fashion as described to decode the binary information of the target wheel.

In the instant embodiment, sensor 22 provides the angle event clock signal for the purpose of decoding the binary pattern of the target wheel as embodied in the permeability of the region immediately beneath sensor 32. The present embodiment also shares the additional benefits of a time based back-up mode of operation should one of the two signals corresponding to the sensors be diagnosed faulty. The decoding in both the angle based and time based modes has previously been described with respect to the dual track preferred embodiment.

The single track embodiment as illustrated utilizes dual element MR sensors. However, it may be desirable to utilize a single element MR sensor in place of sensor 32 since the dual element sensor arrangement's predominant advantage is in edge detection accuracy or precision in detection of transition between regions. A single MR element sensor may still provide the data required for clocking through a simple comparator circuit including a balanced voltage divider applying a threshold voltage at the inverting input of the comparator and the MR element providing the varying voltage input to the non-inverting input of the comparator.

Additionally, it is envisioned that each sensor in the single track embodiment may comprise a single MR element sensor. However, such arrangement may be best suited for applications which require lesser degrees of accuracy in the absolute angle determination.

The preferred embodiments described herein employ magnetoresistive technology and the sensing of permeabilities of regions of a target wheel. It is envisioned that various other sensing technology such as optical sensing may be employed with other appropriate detectable characteristics on the target wheel.

While the invention has been described with respect to certain preferred embodiments, it is envisioned that certain modifications may be apparent to one having ordinary skill in the art. Therefore, the embodimemts described herein are to be taken by way of example and not of limitation.

We claim:

1. A rotational sensor comprising:

a binary encoded target wheel adapted for rotation about an axis including a plurality of angularly delimited regions, each of said regions having one of first and second detectable characteristics and one of first and second non-equivalent angular widths, adjacent ones of said regions having alternate ones of said first and second detectable characteristics, wherein no more than two adjacent regions are of the same one of said first and second non-equivalent angular widths, and each region of one of said first and second non-equivalent angular widths represents a respective bit whose binary value corresponds to the respective one of the first and second detectable characteristics;

first and second sensors adjacent said target wheel, said first and second sensors having an angular separation width that is greater than the smaller one of said first and second non-equivalent angular widths plus a whole number multiple of the sum of the first and second non-equivalent angular widths and less than the larger one of said first and second non-equivalent angular widths plus the whole number multiple of the sum of the first and second non-equivalent angular widths;

said first sensor adapted to provide angular reference signals indicative of the rotation of the target wheel through predetermined angular intervals determined in accordance with adjacent ones of said regions of first and second non-equivalent angular widths;

said second sensor adapted to provide a first bi-stable output state signal having one of first and second output states in accordance with the one of the first and second detectable characteristics of the one of the plurality of regions adjacent thereto; and, means for determiuing respective ones of said first and second output states of the first bi-stable output state signal substantially contemporaneously with each of said angular reference signals, wherein each determined respective one of said first and second output states of said first bi-stable output state signal comprises an angle based decoded bit.

2. A rotational sensor comprising:

a binary encoded target wheel adapted for rotation about an axis including first and second tracks, each track including a plurality of angularly delimited regions, each of said regions having one of first and second permeabilities and one of first and second non-equivalent angular widths, angularly adjacent ones of said regions having alternate ones of said first and second permeabilities, wherein no more than two angularly adjacent regions are of the same one of said first and second non-equivalent angular widths, each track being axially adjacent the other track such that axially adjacent regions are of alternate ones of the first and second permeabilities and of substantially the same angular width, whereby axially adjacent regions define one of first and second cross-track patterns with respect to said first and second permeabilities;

first and second magnetoresistive sensors adjacent said target wheel having an angular separation width that is greater than the smaller one of said first and second non-equivalent angular widths plus a whole number multiple of the sum of the first and second non-equivalent angular widths and less than the larger one of said first and second non-equivalent angular widths plus the whole number multiple of the sum of the first and second non-equivalent angular widths;

said first magnetoresistive sensor adapted to provide angular reference signals indicative of the rotation of the target wheel through predetermined angular intervals;

said second magnetoresistive sensor adapted to provide a first bi-stable output state signal having one of first and second output states in accordance with the one of said first and second cross-track patterns adjacent thereto;

means for determining respective ones of said first and second output states of the first bi-stable output state signal substantially contemporaneously with each of said angular reference signals, wherein each determined respective one of said first and second output states of said first bi-stable output state signal comprises an angle based decoded bit.

3. A rotation sensor as claimed in claim 2 wherein said first magnetoresistive sensor is adapted to provide a second bi-stable output state signal having one of first and second output states in accordance with the one of the first and second permeabilities of the one of said first and second cross-track patterns adjacent thereto further comprising:

means for determining when one of said first and second output state signals is not reliable; and means for comparing respective durations of a pair of adjacent first and second output states of the other one of said first and second bi-stable output state signals corresponding to a pair of angularly adjacent regions of different ones of said first and second non-equivalent angular widths, wherein the relative durations of said first and second output states of said respective pair of adjacent first and second output states comprise a time based decoded bit.

4. A rotation sensor as claimed in claim 2 wherein said target wheel is attached to an internal combustion engine crankshaft.

5. A rotation sensor as claimed in claim 2 wherein said first magnetoresistive sensor comprises a first magnetoresistive element adjacent said first track and a second magnetoresistive element adjacent said second tracks, said second magnetoresistive sensor comprises a third magnetoresistive element adjacent said first track and a fourth magnetoresistive element adjacent said second tracks.

6. A rotation sensor as claimed in claim 2 wherein said first magnetoresistive sensor comprises a first magnetoresistive element adjacent said first track and a second magnetoresistive element adjacent said second tracks, said second magnetoresistive sensor comprises a third magnetoresistive element adjacent one of said first and second tracks.

7. A rotation sensor as claimed in claim 2 wherein said angular separation width is greater than the smaller one of said first and second non-equivalent angular widths and less than the larger one of said first and second non-equivalent angular widths.

8. A rotation sensor as claimed in claim 5 wherein said first magnetoresistive sensor is adapted to provide a second bi-stable output state signal having one of first and second output states in accordance with the one of the first and second permeabilities of the one of said first and second cross-track patterns adjacent thereto further comprising:

means for determining when one of said first and second output state signals is not reliable; and means for comparing respective durations of a pair of adjacent first and second output states of the other one of said first and second bi-stable output state signals corresponding to a pair of angularly adjacent regions of different ones of said first and second non-equivalent angular widths, wherein the relative durations of said first and second output states of said respective pair of adjacent first and second output states comprise a time based decoded bit.

* * * * *